US 6,747,344 B2

(12) United States Patent
Corisis et al.

(10) Patent No.: US 6,747,344 B2
(45) Date of Patent: Jun. 8, 2004

(54) LEAD FRAME ASSEMBLIES WITH VOLTAGE REFERENCE PLANE AND IC PACKAGES INCLUDING SAME

(75) Inventors: David J. Corisis, Meridian, ID (US); Jerry M. Brooks, Caldwell, ID (US); Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/864,698

(22) Filed: May 23, 2001

(65) Prior Publication Data

US 2001/0035571 A1 Nov. 1, 2001

Related U.S. Application Data

(60) Continuation of application No. 09/318,019, filed on May 25, 1999, now Pat. No. 6,284,571, which is a division of application No. 08/888,336, filed on Jul. 2, 1997, now Pat. No. 5,955,777.

(51) Int. Cl.[7] .................. H01L 23/495; H01L 23/48; H01L 23/34
(52) U.S. Cl. ................. 257/668; 257/695; 257/696; 257/713
(58) Field of Search ................. 257/668, 695, 257/6, 96, 713

(56) References Cited

U.S. PATENT DOCUMENTS

| | | | |
|---|---|---|---|
| 4,024,570 A | | 5/1977 | Hartmann et al. |
| 4,594,641 A | | 6/1986 | Hernandez |
| 4,628,411 A | * | 12/1986 | Balderes et al. ............ 361/794 |
| 4,868,635 A | * | 9/1989 | Frechette et al. ........... 257/667 |
| 5,012,323 A | * | 4/1991 | Farnworth ................. 257/723 |
| 5,089,878 A | * | 2/1992 | Lee |
| 5,113,240 A | * | 5/1992 | Bozzini et al. |
| 5,150,194 A | * | 9/1992 | Brooks et al. ............. 257/670 |
| 5,214,845 A | | 6/1993 | King et al. |
| 5,221,858 A | * | 6/1993 | Higgins, III ................ 257/666 |
| 5,233,220 A | | 8/1993 | Lamson et al. |
| 5,276,352 A | * | 1/1994 | Komenaka et al. ......... 257/666 |
| 5,287,000 A | * | 2/1994 | Takahashi et al. .......... 257/676 |
| 5,305,186 A | * | 4/1994 | Appelt et al. |
| 5,343,074 A | * | 8/1994 | Higgins et al. ............. 257/668 |
| 5,378,924 A | | 1/1995 | Liang |
| 5,379,187 A | | 1/1995 | Lee et al. |
| 5,387,554 A | | 2/1995 | Liang |
| 5,396,701 A | | 3/1995 | Russell |
| 5,498,901 A | * | 3/1996 | Chillara et al. ............ 257/666 |
| 5,508,556 A | | 4/1996 | Lin |
| 5,541,446 A | | 7/1996 | Kierse |
| 5,559,306 A | | 9/1996 | Mahulikar |
| 5,583,377 A | * | 12/1996 | Higgins, III |
| 5,589,420 A | | 12/1996 | Russell |
| 5,648,681 A | * | 7/1997 | Takashima et al. ......... 257/666 |
| 5,701,034 A | | 12/1997 | Marrs |
| 5,805,513 A | * | 9/1998 | Takahashi et al. .......... 365/201 |
| 5,977,626 A | | 11/1999 | Wang et al. |
| 5,982,027 A | * | 11/1999 | Corisis |
| 6,025,640 A | | 2/2000 | Yagi et al. |
| 6,133,622 A | * | 10/2000 | Corisis et al. |

* cited by examiner

Primary Examiner—David E. Graybill
(74) Attorney, Agent, or Firm—TraskBritt

(57) ABSTRACT

A semiconductor die assembly employing a voltage reference plane structure electrically isolated from, but in immediate proximity to, leads of a lead frame to which the die is electrically connected. A non-conductive adhesive or an adhesively-coated dielectric film is used to position the voltage reference plane on the leads. The voltage reference plane is electrically connected to a ground or other reference potential pin of the die through a connection to one of the leads. The assembly is encapsulated, preferably by transfer-molding of a filled polymer. More than one discrete voltage reference plane structure may be employed, for example, when the package is of an LOC configuration with two rows of leads, each having a voltage reference plane secured thereto, or a single voltage reference plane including major portions adhered to leads and interposed connection portions may be applied to all of the leads of an assembly.

26 Claims, 2 Drawing Sheets

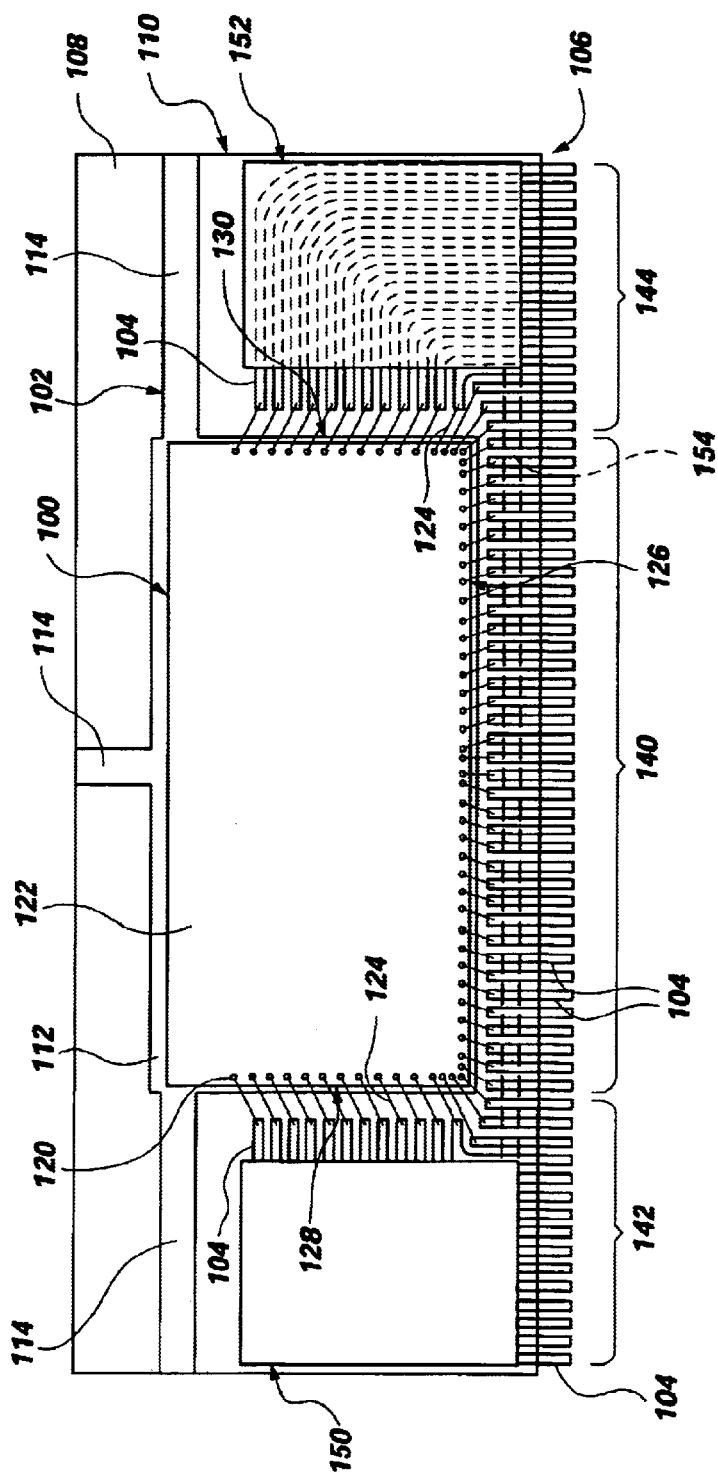
Fig. 1
Fig. 1A
Fig. 1B

LEAD FRAME ASSEMBLIES WITH VOLTAGE REFERENCE PLANE AND IC PACKAGES INCLUDING SAME

CROSS-REFERENCE TO RELATED APPLICATIONS

This application is continuation of application Ser. No. 09/318,019, filed May 25, 1999, now U.S. Pat. No. 6,284,571, which issued Sep. 4, 2001, which is a divisional of application Ser. No. 08/888,336, filed Jul. 2, 1997, now U.S. Pat. No. 5,955,777 which issued Sep. 21, 1999.

BACKGROUND OF THE INVENTION

1. Field of the Invention

The present invention relates to integrated circuit packages employing voltage reference planes and, more specifically, to integrated circuit packages disposing a ground plane or other voltage reference plane in close, substantially coextensive relationship with leads of a lead frame connected to a semiconductor die bearing an integrated circuit.

2. State of the Art

There is a continued trend in the computer industry toward ever-higher speed integrated circuit (IC) assemblies based upon semiconductor die technology. Such high signal speeds, however, lack utility unless accompanied by suppression of system noise to an acceptable level. The trend toward lower operational signal voltages in combination with such high speeds exacerbates noise problems.

At state-of-the art operational speeds, signal propagation delays, switching noise, and crosstalk between signal conductors resulting from mutual inductance and self inductance phenomena of the conductive paths all become significant to signal degradation. Mutual inductance results from an interaction between magnetic fields created by signal currents flowing to and from a lead frame-mounted, packaged IC die through the leads or "lead fingers," while self inductance results from the interaction of the foregoing fields with magnetic fields created by oppositely-directed currents flowing to and from ground.

Therefore, the integrated circuits carried on a semiconductor die would ideally be electrically connected to conductive traces on carrier substrates such as printed circuit boards and thus to other integrated circuits carried on the same or other such substrates by infinitesimally short conductors, eliminating impedance problems such as undesirable inductance and other conductor-induced system noise.

As a practical matter, however, as the capacity and speed of many integrated circuit devices such as dynamic random access memories (DRAMs) have increased, the number of inputs and outputs (I/Os) to each die has increased, requiring more numerous and complex external connections thereto, and, in some instances, requiring undesirably long lead frame lead fingers to place the inner lead ends in contact with, or in close proximity to, the bond pads serving as I/Os for the typical die.

While lead inductance in IC packages has not traditionally been troublesome because slow signal frequencies of past devices render such inductance relatively insignificant, faster and ever-increasing signal frequencies of state-of-the-art electronic systems have substantially increased the practical significance of lead inductance. For example, at such faster signal frequencies, performance of IC dice using lead frames for external electrical connection is slower than desirable because the inductance associated with the lead fingers slows changes in signal currents through the leads, prolonging signal propagation through the leads. Further, digital signals propagating along the lead fingers are dispersing or "spreading out" because the so-called "Fourier" components of various frequencies making up the digital signals propagate through the inductance associated with the lead fingers at different speeds, causing the signal components, and thus the signals themselves, to disperse along the lead fingers. While mild dispersion merely widens the digital signals without detrimental effect, severe dispersion can make the digital signals unrecognizable upon receipt. In addition, so-called "reflection" signals propagating along the lead fingers as a result of impedance mismatches between the lead fingers and associated IC die or between the lead fingers and external circuitry, caused in part by lead-associated inductance, can distort normal signals propagating along the lead fingers concurrently with the reflection signals. Further, magnetic fields created by signal currents propagating through the lead-associated inductance can induce currents in adjacent lead fingers, causing so-called "crosstalk" noise on the latter. While these various effects might be troublesome in any electronic system, the aforementioned trend toward lower voltage systems (currently 3.3 volts) and away from the traditional 5.0 volt systems increases their visibility and significance.

Certain currently-popular die and package configurations serve to exacerbate the noise problems by favoring a large plurality of laterally adjacent lead fingers of substantial length. For example, so-called lead-over-chip (LOC) configurations typically place the bond pads of a die in one or two rows extending along the longitudinal axis of the die. To accommodate the centralized bond pad location for wire-bonding and at the same time eliminate the need for a conventional die-attach paddle as a physical die support, LOC lead frames have been developed which employ lead fingers extending from the sides of the die and over the active surface into close proximity with the bond pad row or rows. The die is then supported from the undersides of the extending lead fingers, typically through an intervening polyimide film such as a Kapton™ tape having an adhesive coating on its upper and lower surfaces, the film serving as a dielectric, an alpha barrier and a protective coating for the active surface.

While a mechanically desirable packaging concept, the LOC-type long, mutually parallel lead finger runs over the active surface become abusive in terms of unacceptably increasing real impedance as well as lead inductance (both self and mutual) in the circuit. These lead finger runs also increase signal reflection in the circuit due to transmission line effects and degrade signal integrity due to the aforementioned propagation delays, switching noise, and crosstalk. Further, elimination of the die-attach paddle also eliminates the potential for employing a ground plane under the die without additional processing steps, and such a ground plane in any case would not alleviate the problems attendant to use of the long lead fingers extending over the die's active surface.

LOC configurations are merely one example of the type of packaging promoting the above-referenced undesirable noise phenomena. However, the same undesirable characteristics may be experienced with other lead frame configurations employing extended lead fingers, particularly large groups of such lead fingers in close mutual proximity. Such configurations include lead-under-chip (LUC) configurations, and configurations wherein a large number of leads extend from several sides of a semiconductor die to a single side or edge of a package, such as in a vertical surface mount package, or VSMP.

Packages have previously been configured in an attempt to reduce package noise of the type described above. For example, U.S. Pat. No. 5,214,845, assigned to the assignee of the present invention, employs a flexible, laminated sandwich assembly of an outer ground plane and an outer power plane dielectrically isolated from a series of conductive traces running therebetween. The traces and planes are connected to corresponding bond pads on the die at one end, and to lead fingers on the other, as by thermocompression bonding (in the case of a TAB embodiment) or by wire bonds. Such an arrangement obviously doubles the number of required I/O connections, necessitating additional fabrication time and increasing the possibility of a faulty connection. Further, the flexible sandwich assembly constitutes an additional element of the package, increasing material cost.

Another approach to the problem is disclosed in U.S. Pat. No. 5,559,306, wherein metal plates are employed above and below leads extending to the exterior of plastic and ceramic packages to effect reduction of self and mutual inductance. However, such configurations as disclosed appear to require relatively complex fabrication techniques to locate and fix the plates relative to the die and lead fingers or other conductors for subsequent transfer molding of a filled-polymer vackage thereabout, while the ceramic package embodiment is not cost-effective for high-volume, commercial packaging.

Accordingly, the inventors have recognized the need for a low-cost, reduced-inductance circuit configuration adaptable to current packaging designs and employing conventional and readily-available materials, equipment and fabrication techniques.

SUMMARY OF THE INVENTION

The present invention comprises a packaged semiconductor device wherein inductance and impedance of a group of adjacent, substantially co-planar lead fingers are reduced, and reflection and signal integrity improved, through the use of at least one voltage reference plane element in close, overlapping or superimposed proximity to the plane of the leads. While in many, if not most, instances the voltage potential will be connected to ground, or $V_{ss}$, it is contemplated that there are some applications where another reference potential may be employed with the plane element. Accordingly, the term "voltage reference plane" or "voltage reference plane element" as used herein is intended to encompass a plane or plane element connected to ground as well as a plane connected to another reference potential.

The semiconductor device of the present invention is especially suitable for so-called "plastic" packaging, such process comprising the transfer-molding of a particle-filled polymer about an assembled and electrically-connected die and lead frame.

In a preferred embodiment, the voltage reference plane element comprises a foil, sheet or plate of a high-conductivity, low-resistivity material, such as copper or an alloy thereof, adhered to the lead finger group through a dielectric, or electrically insulating material. The lead finger group, in turn, may be adhered to a surface of the die (in an LOC or LUC lead frame configuration). Alternatively, the lead finger group may lie outboard of the die periphery with the die being mounted on a die-attach paddle in a more conventional lead frame configuration which may, nonetheless, as in the case of a VSMP lead frame, contain one or more large groups of excessively long lead fingers.

The voltage reference plane of the present invention, in all of its variations, reduces the self inductance associated with closely-adjacent, elongated lead fingers by reducing the magnetic flux caused by oppositely directed currents flowing in the lead fingers and ground. The voltage reference plane reduces the self inductance through an increase in effective width and a decrease in the distance between the voltage reference plane and the lead fingers. Similarly, the immediate proximity of the voltage reference plane to the closely laterally adjacent lead fingers of a lead frame exhibiting troublesome inductance characteristics reduces mutual inductance by interruption of the magnetic fields generated by adjacent lead fingers and thus the effects of their interaction. Thus, the effect of the voltage reference plane of the present invention can be adjusted by varying its size and shape, its distance from the lead fingers, or a combination thereof The voltage reference plane arrangement of the invention also provides at least a nominal heat sink effect to the semiconductor device as encased in a transfer-molded plastic package, promoting more even distribution of heat generated during operation of the semiconductor die than might be achieved through the lead fingers alone. The heat sink effect may, of course, be enhanced by increasing the mass of the voltage reference plane, as by enhancing its thickness within the constraints of the package dimensions, or of configuring the plane with one or more portions extending to the exterior of the plastic package. While this latter approach may render the device more susceptible to external radio frequency interference, such an arrangement may be shielded, if necessary, by techniques known in the art.

A further advantage of the present invention resides in the mechanical support and protection provided the lead fingers of the lead frame by the voltage reference plane(s). To elaborate and by way of example only, a strip of conventional lead frames exposes the inner, unsupported ends of the lead fingers to substantial risk of bending and other damage during transport, handling and fabrication steps prior to transfer molding. By adhesively bonding a TAB-type metal foil and polyimide (for example, Kapton™ film) laminate voltage reference plane element to each group of lead fingers (for example, one voltage reference plane clement running transversely across each of two facing groups of lead fingers in an LOG-type frame), the lead fingers are locationally fixed and protected to some extent from damage prior to affixation of the dice to the lead frame strip.

Should the device to be fabricated comprise an LOC device, conventional polyimide or other dielectric tape or film strips may be adhered to the side of the lead fingers opposite to the voltage reference plane elements, and the dice subsequently adhered to the tape strips by their active surfaces as known in the art prior to electrical connection of the dice and lead frames. The voltage reference plane element(s) may be electrically connected to the ground ($V_{ss}$) (or, as noted above, other suitable potential) pin of the lead frame by wire bond, spot weld or other thermocompression-type bond, conductive epoxy, a Z-axis adhesive element, or other technique known in the art, the specific connection technique employed being largely a function of convenience and the technique to be employed for connecting the bond pads of the dice to the lead fingers.

It will be recognized and appreciated by those of skill in the art that the voltage reference plane elements according to the present invention may be employed as an enhancement to any conventional plastic package design having adequate depth between the lead fingers and the exterior surface of the package.

While it is preferred that the voltage plane elements be placed over the lead fingers for ease of effecting a plane-to-$V_{ss}$ or other pin connection, it is also contemplated that in some instances, it may be desirable to place the voltage reference plane elements under the lead fingers, such as between the lead fingers and the surface of the die in an LOC or LUC arrangement, or merely under the leads in a conventional die-attach paddle lead frame configuration. In the latter instance, more package clearance (depth) for the voltage reference plane elements may exist under the lead fingers than over.

BRIEF DESCRIPTION OF THE SEVERAL VIEWS OF THE DRAWINGS

FIG. 1 comprises a top elevation of a VSMP-configured die and lead frame package assembly employing voltage reference plane elements according to the present invention;

FIGS. 1A and 1B are enlarged side views of the assembly of FIG. 1, depicting alternative lead finger-to-voltage reference-plane connections;

DETAILED DESCRIPTION OF THE INVENTION

Figure 2:
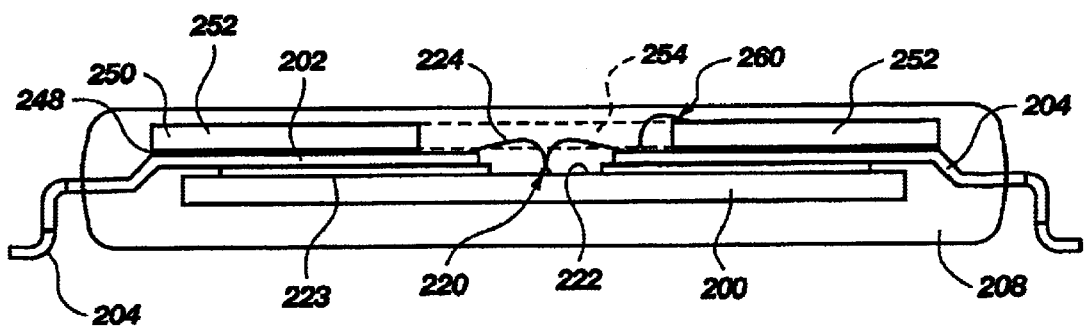
FIG. 2 comprises a side elevation of an LOC-configured die and lead frame assembly employing voltage reference plane elements according to the present invention.

FIG. 1 shows a semiconductor die, also termed an "IC die," 100 according to the present invention, mounted to a lead frame 102 in a vertical surface mount package (VSMP) configuration, wherein all of the lead fingers 104 of lead frame 102 are configured to exit the package for external connection along a single side or edge 106 of the package 108, an outline of the package boundary being shown at line 110. Package 108 preferably comprises a so-called "plastic" package comprising a transfer-molded, filled polymer compound, as known in the art. However, alternative packaging such as preformed ceramic packages and potted encapsulants may also be used in the present invention.

As shown, lead frame 102 further includes a die-attach paddle 112, to which the back side of die 100 is secured as with a eutectic solder or an epoxy adhesive, as known in the art. The adhering material is preferably heat-conductive to aid in heat distribution and transfer of the die to paddle 112. Extensions 114 from die-attach paddle 112 formerly extended to the outer, supporting structure of a lead frame strip from which lead frame 102 was severed after transfer molding in a conventional trim and form operation.

Bond pads 120 on the active surface 122 of die 100 are connected to lead fingers 104 of lead frame 102 by wire bonds 124 to pass signals between the integrated circuitry of die 100 and external circuitry (not shown) such as conductive traces on a carrier substrate (i.e., a printed circuit board), other dice carried on and electrically connected to the carrier substrate, and other conductors and active and passive components packaged in the same or a higher level. It should be understood, however, that the present invention is not limited to wire-bonded connections, and that device assemblies using direct thermocompression bonding of lead fingers to bond pads, or using flex-circuit type connections between bond pads and lead fingers using conductors in a preformed pattern carried on a thin dielectric (termed "TAB" connections, for tape automated bonding), may also benefit from the present invention.

As shown, the central group 140 of lead fingers 104 extending between the side 126 of die 100 lying closest to package edge 106 are extremely short, straight, mutually parallel and of uniform length, while those lead fingers 104 of flanking side groups 142 and 144 extending between transverse sides 128 and 130 of die 100 and package edge 106 are of various lengths, and most of the lead fingers 104 of groups 142 and 144 curve as they make a 90 degree turn from respective orientations perpendicular to die sides 128 and 130 to one perpendicular to package side 106 as they exit the latter.

Voltage reference planes 150 and 152 are superimposed on substantially all of the lead fingers 104 of groups 142 and 144. Voltage reference planes 150 and 152 preferably comprise a low resistivity, high conductivity sheet of material such as copper or gold, although copper is preferred from a cost standpoint. Voltage reference planes 150 and 152 are adhered to the lead fingers 104 of groups 142 and 144 by an intervening adhesive dielectric or insulating structure 148 (see FIGS. 1A and 1B), which preferably comprises a polyimide tape or film 148 (see FIGS. 1A and 1B) such as Kapton™ film carrying an adhesive on both surfaces thereof. Voltage reference planes 150 and 152 may be electrically connected to ground ($V_{ss}$) pins or lead fingers 104 of lead frame 102 by suitable means such as a spot weld or other thermocompression bond 160 through dielectric 148 as shown in enlarged side view in FIG. 1A, or through a conductive epoxy or Z-axis conductor adhesive element 162 extending through an aperture in dielectric 148 as shown in enlarged side view in FIG. 1B. Alternatively, and as shown in FIG. 2, the electrical connection may be made by a wire bond. As noted previously, in lieu of being connected to ground ($V_{ss}$), voltage reference planes may be connected to another DC potential, such as a $V_{ref}$ used for signaling purposes, or even power ($V_{cc}$). In some high speed DRAM applications, $V_{ref}$ is used for signaling purposes, and may be a particularly suitable non-ground potential.

Voltage reference planes 150 and 152 may be of any suitable thickness within the limitations imposed by package depth, and are preferably secured to lead fingers 104 of lead frame 102 when in strip form with other identical lead frames of the strip prior to attachment thereto of dice, and are most preferably applied to the lead frame strip during fabrication of the latter. This most preferred approach affords the added benefit of protecting the free, unsupported ends of lead fingers 104 of the lead frame 102 during transit and handling, and ensures precise alignment thereof during bond pad-to-lead finger wire bonding after die attach. Toward that end, and as shown in broken lines, voltage reference planes 150 and 152 may in fact comprise elements of a single voltage reference plane, joined by intervening neck 154 extending over and adhered to lead fingers 104 of central group 140. This approach also simplifies handling and application of the voltage reference plane elements, fixes the lead fingers 104 of central group 140 in place, reduces the number of parts handled and alignments required, and requires but a single connection for both "sides" of the voltage reference planes of the assembly. Voltage reference planes 150 and 152, whether discrete or connected as parts or elements of a single voltage reference plane through neck 154, control the long-lead impedance of the extended, varying length lead fingers of side groups 142 and 144 and alleviate the aforementioned detrimental effects of such configurations by lowering inductance, improving reflection and providing better signal integrity. Signal integrity through the short lead fingers 104 of central group 140 also benefits from the presence of voltage reference plane neck 154, but obviously to a lesser extent than the elongated, non-uniform-length lead fingers 104 of side groups 142 and 144.

As depicted in FIG. 1, die 100 comprises a 64 megabit VSMP-configured, sixty-six (66) lead dynamic random access memory (DRAM), although the invention is not limited to the package configuration shown and described, or to a DRAM or other memory die (including without limitation SDRAMS, RDRAMS, SLDRAMS, SGRAMS, SRAMS, EEPROMS and flash memory), the invention also having utility with regard to processors and application-specific integrated circuits (ASICs).

Referring to FIG. 2 of the drawings, lead fingers 204 of lead frame 202 of the previously-described LOC configuration extend over the active surface 222 of die 200, being adhered thereto by a dielectric tape 223 such as the aforementioned Kapton™ type having an adhesive on each side thereof. Wire bonds 224 extend between bond pads 220 disposed in a central longitudinal row on active surface 222 and inner ends of lead fingers 204. Voltage reference plane 250, which in this instance comprises a frame-like structure having two elongated parallel sections or elements 252 joined at their ends by mutually transverse sections 254 (one shown in broken lines), is adhered to the exposed upper surfaces of lead fingers 204 by an insulating or dielectric material 248, such as a non-conductive epoxy. Alternatively, another layer of polyinude or other dielectric tape or film having an adhesive on each side thereof may be used to adhere voltage reference plane 250 to the tops of lead fingers 204 while mutually electrically insulating the elements. As shown in FIG. 2, voltage reference plane 250 may be of substantial depth or thickness in comparison to the total depth of transfer-molded plastic package 208, the large mass of voltage reference plane 250 acting as a heat sink to promote heat transfer from die 200 in operation. Also notable in FIG. 2 is the wire bond 260 extending between a ground ($V_{ss}$) or other reference potential pin lead finger 204 and voltage reference plane 250, whereby voltage reference plane 250 is electrically connected thereto.

Figure 3:
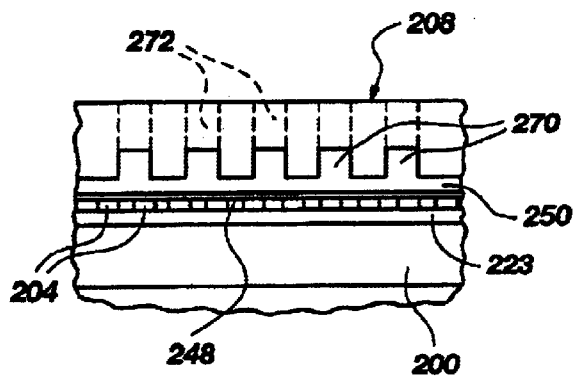
FIG. 3 comprises an enlarged side elevation of a portion of an LOC-configured die and lead frame assembly as depicted in FIG. 2, but employing a voltage reference plane element modified to provide enhanced heat transfer and distribution capabilities.

If desired, or required by excessive heat output from a particular die, as shown in FIG. 3, a voltage reference plane 250 of the present invention may be configured with additional mass in the form of fins or other projections 270 opposite exemplary lead fingers 204 attached thereto through dielectric 248 and extending transversely to the voltage reference plane, and such projections 270 may even extend to the exterior of the filled polymer material of the package 208 surrounding a die as shown in broken lines 272. Other mass-increasing configurations are, of course, possible and limited only by the available interior space of the package and the need to maintain the electrical performance of the packaged device. The approach of extending a portion of the voltage reference plane to the exterior of the package may, of course, render the device susceptible to external radio frequency interference. However, shielding techniques are known in the art, and may be employed if necessary with a package so configured.

Figure 4:
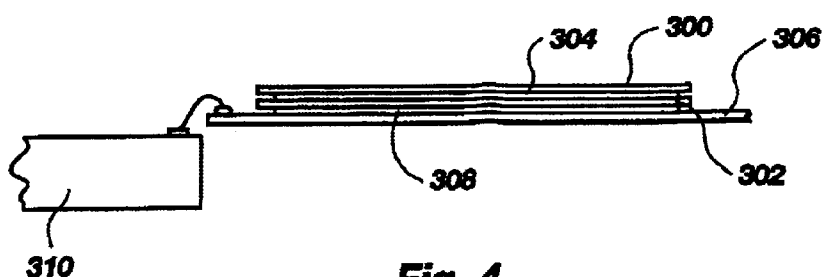
FIG. 4 comprises a side elevation of two superimposed voltage reference planes in combination with an associated lead frame and semiconductor die.

As shown in FIG. 4 of the drawings, voltage reference planes 300 and 302 according to the invention may also be disposed in a "sandwich" configuration, with an intervening dielectric 304 and in close proximity to lead fingers 306 and insulated therefrom by dielectric 308. The electrical field interaction between the two planes 300 and 302 creates a decoupling capacitance of one reference relative to the other, benefitting the electrical performance of the integrated circuitry carried by the associated die 310.

The voltage reference planes of the present invention are preferably sized, configured and shaped to extend over a substantial portion of the lead fingers contained within the package surrounding the semiconductor die, and located in as close a proximity as practicable while maintaining the ground plane electrically isolated from the adjacent lead fingers. By its position in close, immediate proximity to the lead fingers, the voltage reference plane magnetically couples thereto to reduce the self and mutual inductance associated with the lead fingers.

To maximize the benefit of the invention during implementation thereof, an attempt should be made to maximize the coverage of the voltage reference plane or planes over the surface area, and actually beyond the surface area, encompassed by the lead fingers. It may be preferable, to obtain a minimum beneficial effect from the invention, to provide a voltage reference plane which provides coverage of at least about fifty percent (50%) of the associated lead finger group's surface area (measured in the major plane of the lead frame), although forty percent (40%) coverage might provide a modest improvement, given the low implementation cost of the invention. The lead finger surface area coverage by the voltage reference plane or planes would, in normal practice of the invention, be measured with regard to the lead finger portions contained inside a package, and not the entire lead finger lengths. It is further desirable, if possible, to extend the plane or planes laterally beyond the sides of the end lead fingers of a group, since the electrical field lines tend to be radial. It is also noteworthy that the voltage reference planes of the invention also provide a modest improvement to electromagnetic interference (EMI) shielding. Finally, as those of ordinary skill in the art will appreciate, the beneficial effect of the invention also is dependent upon the distance between a voltage reference plane and its associated leads, as well as the material chosen for the dielectric.

As a matter of practical and effective implementation of the present invention, there are several factors to be accommodated. First, if the lead fingers are to be wire-bonded to the die bond pads, the voltage reference plane edge should terminate short of the inner end of each lead finger, so as to provide adequate clearance for the wire-bonding capillary at the desired lead finger bond site. Additionally, the transverse distance or space between the voltage reference plane and lead fingers should be minimized, in order to maximize the beneficial effects of the invention. Finally, coverage of the lead fingers by the voltage reference plane should be maximized, but the periphery of the plane should be contained within the material of the package surrounding the die and lead frame combination, with enough space or clearance between the edges of the plane and the exterior of the package so that package integrity and reliability is not affected.

While the invention has been disclosed in terms of specific, exemplary illustrated embodiments, those of ordinary skill in the art will appreciate that additions, deletions and modifications to the disclosed embodiments may be made without departing from the scope of the invention as hereinafter claimed.

What is claimed is:

1. A semiconductor die assembly comprising:
   a semiconductor die having a plurality of bond pads on an active surface thereof;
   a lead frame having at least a first group of lead fingers and a second group of lead fingers to respectively extend from first and second opposing sides of said semiconductor die attached to a die-attach location on said lead frame to another, single side of said lead frame in a substantially mutually parallel configuration;
   a first voltage reference plane adjacent to said first side of said semiconductor die, said first voltage reference plane underlying at least a portion of said first group of lead fingers extending from said first side of said semiconductor die toward said another, single side of said lead frame; and
   a second voltage reference plane adjacent to said second opposing side of said semiconductor die, said second voltage reference plane underlying at least a portion of said second group of lead fingers extending from said second opposing side of said semiconductor die toward said another, single side of said lead frame.

2. The assembly of claim 1, wherein said lead frame comprises a vertical surface
   mount package configuration.

3. The assembly of claim 1, wherein said first voltage reference plane and said second voltage reference plane are adhered to at least some of the lead fingers of said first group of lead fingers and said second group of lead fingers, respectively.

4. The assembly of claim 3, wherein said first voltage reference plane and said second voltage reference plane are adhered directly via a non-conductive adhesive to said at least some of the lead fingers of said first group of lead fingers and said second group of lead fingers, respectively.

5. The assembly of claim 1, further comprising a packaging material encapsulating at least said active surface of said semiconductor die.

6. The assembly of claim 5, wherein said packaging material at least partially covers said first and said second voltage reference planes and said first and said second groups of lead fingers.

7. The assembly of claim 1, wherein said lead frame includes a die-attach paddle to which said semiconductor die is attached.

8. The assembly of claim 1, wherein said die-attach location comprises a die-attach paddle.

9. The assembly of claim 1, wherein said first voltage reference plane and said second voltage reference plane are electrically connected to at least one lead finger of said first group of lead fingers and said second group of lead fingers, respectively, which in turn is connected through a bond pad to a reference potential of said semiconductor die.

10. The assembly of claim 1, wherein at least one of said first voltage reference plane and said second voltage reference plane includes a plurality of projections extending outwardly from a surface of said at least one of said first voltage reference plane and said second voltage reference plane.

11. The assembly of claim 10, further comprising a packaging material extending over at least one of said first voltage reference plane and said second voltage reference plane, wherein said projections extend through said packaging material.

12. The assembly of claim 11, wherein said projections extend through said packaging material to an exterior surface thereof.

13. The assembly of claim 1, wherein said first voltage reference plane and said second voltage reference plane are of sufficient mass to measurably alter heat transfer characteristics of said assembly.

14. The assembly of claim 1, further comprising a packaging material encapsulating said assembly so that only outer ends of said at least said first group of lead fingers and said second group of lead fingers extend therethrough.

15. The assembly of claim 1, wherein said first voltage reference plane and said second voltage reference plane extend over at least about fifty percent of a surface area of said at least said first group of lead fingers and said second group of lead fingers, respectively.

16. The assembly of claim 1, wherein said first voltage reference plane and said second voltage reference are separated from said at least said first group of lead fingers and said second group of lead fingers, respectively, by an insulating adhesive structure.

17. The assembly of claim 16, wherein said insulating adhesive structure comprises an insulating film having an adhesive on opposing surfaces thereof, one surface of said opposing surfaces being adhered to at least one of said first group of lead fingers and said second group of lead fingers and another surface of said opposing surfaces being adhered to at least one of said first voltage reference plane and said second voltage reference plane.

18. A vertical surface mount lead frame to be assembled to a semiconductor die, comprising:
    a lead frame having at least a first group of lead fingers and a second group of lead fingers to respectively extend from first and second opposing sides of an intended die-attach location to another, single side of said lead frame in a substantially mutually parallel configuration;
    a first voltage reference plane in immediate proximity to said first group of lead fingers and in electrical isolation therefrom, said first voltage reference plane extending across at least a turning portion of said first group of lead fingers extending from said first side of said intended die-attach location toward said another, single side of said lead frame;
    a second voltage reference plane in immediate proximity to said second group of lead fingers and in electrical isolation therefrom, said second voltage reference plane extending across at least a turning portion of said second group of lead fingers extending from said second opposing side of said intended die-attach location toward said another, single side of said lead frame; and
    an intervening neck extending across said another, single side of said lead frame and conductively connecting said first voltage reference plane and said second voltage reference plane.

19. The assembly of claim 18, wherein said first voltage reference plane and said second voltage reference plane are adhered to at least some of the lead fingers of said first group of lead fingers and said second group of lead fingers, respectively.

20. The assembly of claim 19, wherein said first voltage reference plane and said second voltage reference plane are adhered directly via a non-conductive adhesive to said at least some of the lead fingers of said first group of lead fingers and said second group of lead fingers, respectively.

21. The assembly of claim 18, wherein said lead frame includes a die-attach paddle to which said semiconductor die is attached.

22. The assembly of claim 18, wherein said die-attach location comprises a die-attach paddle.

23. The assembly of claim 18, wherein at least one of said first voltage reference plane and said second voltage reference plane includes projections extending away from a direction of said immediate proximity of said first group of lead fingers and said second group of lead fingers, respectively.

24. The assembly of claim 18, wherein said first voltage reference plane and said second voltage reference plane extend across at least about fifty percent of a surface area of said at least said first group of lead fingers and said second group of lead fingers, respectively.

25. The assembly of claim 18, wherein said first voltage reference plane and said second voltage reference is separated from said at least said first group of lead fingers and said second group of lead fingers, respectively, by an insulating adhesive structure.

26. The assembly of claim 25, wherein said insulating adhesive structure comprises an insulating film having an adhesive on opposing surfaces thereof, one surface of said opposing surfaces being adhered to at least one of said first group of lead fingers and said second group of lead fingers and another surface of said opposing surfaces being adhered to at least one of said first voltage reference plane and said second voltage reference plane.

\* \* \* \* \*